(12) United States Patent
Bockelman (10) Patent No.: US 6,510,191 B2
(45) Date of Patent: Jan. 21, 2003

(54) DIRECT DIGITAL SYNTHESIZER BASED ON DELAY LINE WITH SORTED TAPS

(75) Inventor: David E. Bockelman, Weston, FL (US)

(73) Assignee: Motorola, Inc., Schaumburg, IL (US)

( * ) Notice: Subject to any disclaimer, the term of this patent is extended or adjusted under 35 U.S.C. 154(b) by 43 days.

(21) Appl. No.: 09/780,077

(22) Filed: Feb. 9, 2001

(65) Prior Publication Data
US 2002/0110211 A1 Aug. 15, 2002

(51) Int. Cl.[7] .................................................. H04L 7/00
(52) U.S. Cl. ........................ 375/371; 327/269; 455/260; 708/271; 713/401
(58) Field of Search ................................ 375/354, 371, 375/373, 376; 327/269–284, 105–107, 241; 713/400, 401, 500, 501, 503, 600; 455/76, 165.1, 183.1, 260; 311/1 A, 2, 34; 708/271

(56) References Cited

U.S. PATENT DOCUMENTS

| | | | | |
|---|---|---|---|---|
| 4,290,022 A | * | 9/1981 | Puckette | ...................... 327/241 |
| 5,889,436 A | * | 3/1999 | Yeung et al. | ................... 331/2 |
| 5,977,805 A | * | 11/1999 | Vergnes et al. | ............. 327/107 |
| 6,104,223 A | * | 8/2000 | Chapman et al. | ........... 327/276 |

* cited by examiner

Primary Examiner—Stephen Chin
Assistant Examiner—Chieh M. Fan
(74) Attorney, Agent, or Firm—Andrew S. Fuller (57) ABSTRACT

A digital frequency synthesizer includes a clock which produces a clock signal oscillating at a fixed frequency and a delay line which receives the clock signal and which produces therefrom a plurality of phase shifted clock signals oscillating at the fixed frequency. Each phase shifted clock signal is shifted in phase with respect to the clock signal and with respect to the other phase shifted clock signals. A look-up table receives an address value related to an ideal phase shifted clock signal oscillating at the fixed frequency and outputs a tap address related to the address value. A selection circuit receives the plurality of phase shifted clock signals and the tap address and outputs one of the phase shifted clock signals in response thereto. A sampling circuit samples at least a portion of the one phase shifted clock signal output by the selection circuit and outputs the sampled portion to form at least a part of an oscillator signal having a desired frequency.

20 Claims, 8 Drawing Sheets

| COLUMN (1) ADDRESS VALUE | (2) TAP ADDRESS | (3) IDEAL PHASE DELAY (CLOCK CYCLE) | (4) NORMALIZED IDEAL PHASE DELAY (CLOCK CYCLE) | (5) ACTUAL PHASE DELAY (CLOCK CYCLE) | (6) NORMALIZED ACTUAL PHASE DELAY (CLOCK CYCLE) |
|---|---|---|---|---|---|
| 1 | 1 | 0.13 | 0.13 | 0.17 | 0.17 |
| 2 | 2 | 0.26 | 0.26 | 0.22 | 0.22 |
| 3 | 3 | 0.39 | 0.39 | 0.35 | 0.35 |
| 4 | 4 | 0.52 | 0.52 | 0.56 | 0.56 |
| 5 | 5 | 0.65 | 0.65 | 0.65 | 0.65 |
| 6 | 6 | 0.78 | 0.78 | 0.69 | 0.69 |
| 7 | 7 | 0.91 | 0.91 | 0.95 | 0.95 |
| 8 | 8 | 1.04 | 0.04 | 1.09 | 0.09 |
| • | • | • | • | • | • |
| • | • | • | • | • | • |
| • | • | • | • | • | • |
| 62 | 62 | 7.17 | 0.17 | 7.13 | 0.13 |
| 63 | 63 | 7.30 | 0.30 | 7.26 | 0.26 |
| 64 | 64 | 7.43 | 0.43 | 7.39 | 0.39 |
| 65 | 65 | 7.56 | 0.56 | 7.52 | 0.52 |
| 66 | 66 | 7.69 | 0.69 | 7.78 | 0.78 |
| 67 | 67 | 7.82 | 0.82 | 7.82 | 0.82 |
| 68 | 68 | 7.95 | 0.95 | 7.92 | 0.92 |
| 69 | 69 | 8.09 | 0.09 | 8.04 | 0.04 |
| 70 | 70 | 8.22 | 0.22 | 8.30 | 0.30 |
| 71 | 71 | 8.35 | 0.35 | 8.43 | 0.43 |

*FIG. 5*

| COLUMN (1) ADDRESS VALUE | (2) TAP ADDRESS | (3) NORMALIZED IDEAL PHASE DELAY (CLOCK CYCLE) | (4) NORMALIZED ACTUAL PHASE DELAY (CLOCK CYCLE) |
|---|---|---|---|
| 1 | 62 | 0.13 | 0.13 |
| 2 | 63 | 0.26 | 0.26 |
| 3 | 64 | 0.39 | 0.39 |
| 4 | 65 | 0.52 | 0.52 |
| 5 | 5 | 0.65 | 0.65 |
| 6 | 66 | 0.78 | 0.78 |
| 7 | 68 | 0.91 | 0.92 * |
| 8 | 69 | 0.04 | 0.04 |
| ... | ... | ... | ... |
| 62 | 1 | 0.17 | 0.17 |
| 63 | 70 | 0.30 | 0.30 |
| 64 | 71 | 0.43 | 0.43 |
| 65 | 4 | 0.56 | 0.56 |
| 66 | 6 | 0.69 | 0.69 |
| 67 | 67 | 0.82 | 0.82 |
| 68 | 7 | 0.95 | 0.95 |
| 69 | 8 | 0.09 | 0.09 |
| 70 | 2 | 0.22 | 0.22 |
| 71 | 3 | 0.35 | 0.35 |

DIRECT DIGITAL SYNTHESIZER BASED ON DELAY LINE WITH SORTED TAPS

BACKGROUND OF THE INVENTION

1. Field of the Invention

The present invention is related to a frequency synthesizer and, more particularly, a digital frequency synthesizer.

2. Background Art

Digital frequency synthesizers are well known in the art. One form of digital frequency synthesizer includes a digital-to-phase converter (DPC) having a delay lock loop (DLL) which includes a delay line. A problem with delay lines is that they suffer from delay variations along the delay line, which ultimately limits phase resolution and, hence, the spurious frequency performance of the digital frequency synthesizer.

It is desirable to provide a digital frequency synthesizer having improved phase resolution over prior art DLLs while avoiding the use of tuning circuitry or the cancellation of delay mismatches while also achieving −80 dBc spurious frequency performance.

DETAILED DESCRIPTION OF THE PREFERRED EMBODIMENTS

The present invention will be described with reference to the accompanying Figures where like reference numbers correspond to like elements.

Figure 1:
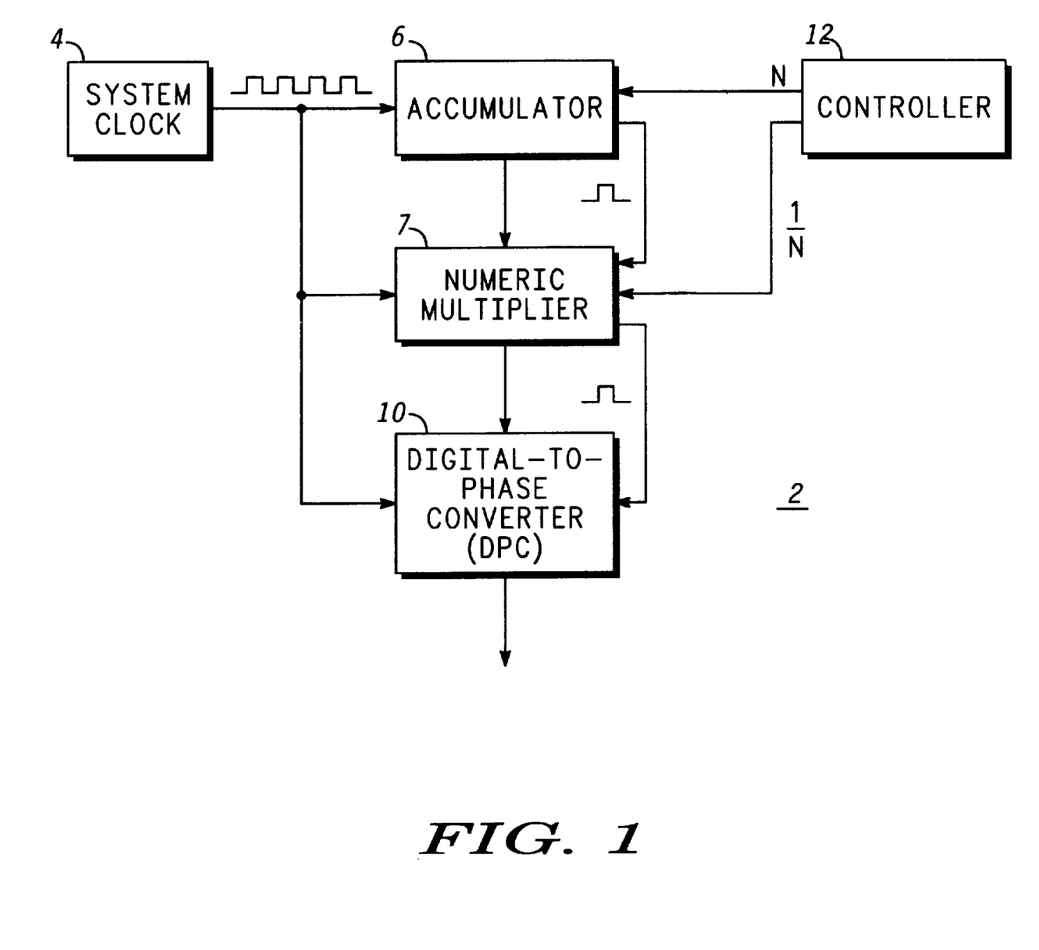
FIG. 1 is a block diagram of a digital frequency synthesizer in accordance with the present invention.

With reference to FIG. 1, a frequency synthesizer 2 in accordance with the present invention includes a system clock 4 which outputs a fixed frequency reference clock signal to inputs of an accumulator 6, a numeric multiplier 8 and a digital-to-phase converter (DPC) 10. A controller 12 supplies to accumulator 6 and numeric multiplier 8 a frequency control value N and an inverse frequency control value 1/N, respectively. Numeric multiplier 8 is configured to receive from accumulator 6 a series of accumulator values and an accumulator overflow signal. DPC 10 is configured to receive from numeric multiplier 8 a series of address values, and a corresponding series of latch signals.

In operation, accumulator 6 is clocked on the leading edge of the reference clock signal. At each leading edge, accumulator 6 increments its contents by the frequency control value N. For each cycle of the reference clock signal where the capacity of accumulator 6 is exceeded, accumulator 6 generates the accumulator overflow signal and generates an accumulator value corresponding to the value in accumulator 6 when the accumulator overflow signal is generated. The average frequency of the accumulator overflow signal equals the frequency of the reference clock signal multiplied by the ratio of the frequency control value N to the capacity of the accumulator C, where the capacity of the accumulator is equal to one plus the maximum value that can be stored in the accumulator.

A frequency of an output clock signal generated by DPC 10 matches the frequency of the accumulator overflow signal. If the output pulses of the accumulator overflow signal are uniformly spaced, the accumulator overflow signal could be utilized as the output clock signal thereby avoiding the need for numeric multiplier 8 and DPC 10. However, because accumulator 6 has a predetermined number of accumulator bits, e.g., 32 bits, and the value of frequency control value N is often not an integer multiple of the value of the number of accumulator bits, the output pulses of the accumulator overflow signal are not uniformly spaced. In the frequency domain, this non-uniform spacing results in unwanted spurious frequencies in the output clock signal. Correction is therefore needed to shift or interpolate the phase of each pulse to produce uniform spacing between pulses in the output clock signal.

In order to determine the extent of phase shift necessary to produce uniform spacing between pulses, each instance accumulator 6 outputs an accumulator overflow signal, numeric multiplier 8 multiplies the accumulator value output by accumulator 6 concurrent with the accumulator overflow signal by the inverse frequency control value, i.e., 1/N. Multiplying the accumulator value by the inverse frequency control value converts the accumulator value to a fraction corresponding to a difference between a desired temporal position of that instance of the accumulator overflow signal and its actual temporal position. This fraction represents the fractional amount of one clock cycle of the reference clock signal by which the accumulator overflow signal must be phase shifted in order to achieve uniform spacing between output pulses thereof. Each fraction produced in response to numeric multiplier 8 receiving an accumulator overflow signal is supplied as an address value to DPC 10 for processing and conversion into the output clock signal having the same frequency as the average frequency of the accumulator overflow signal, but with the output pulses being uniformly spaced.

Figure 2:
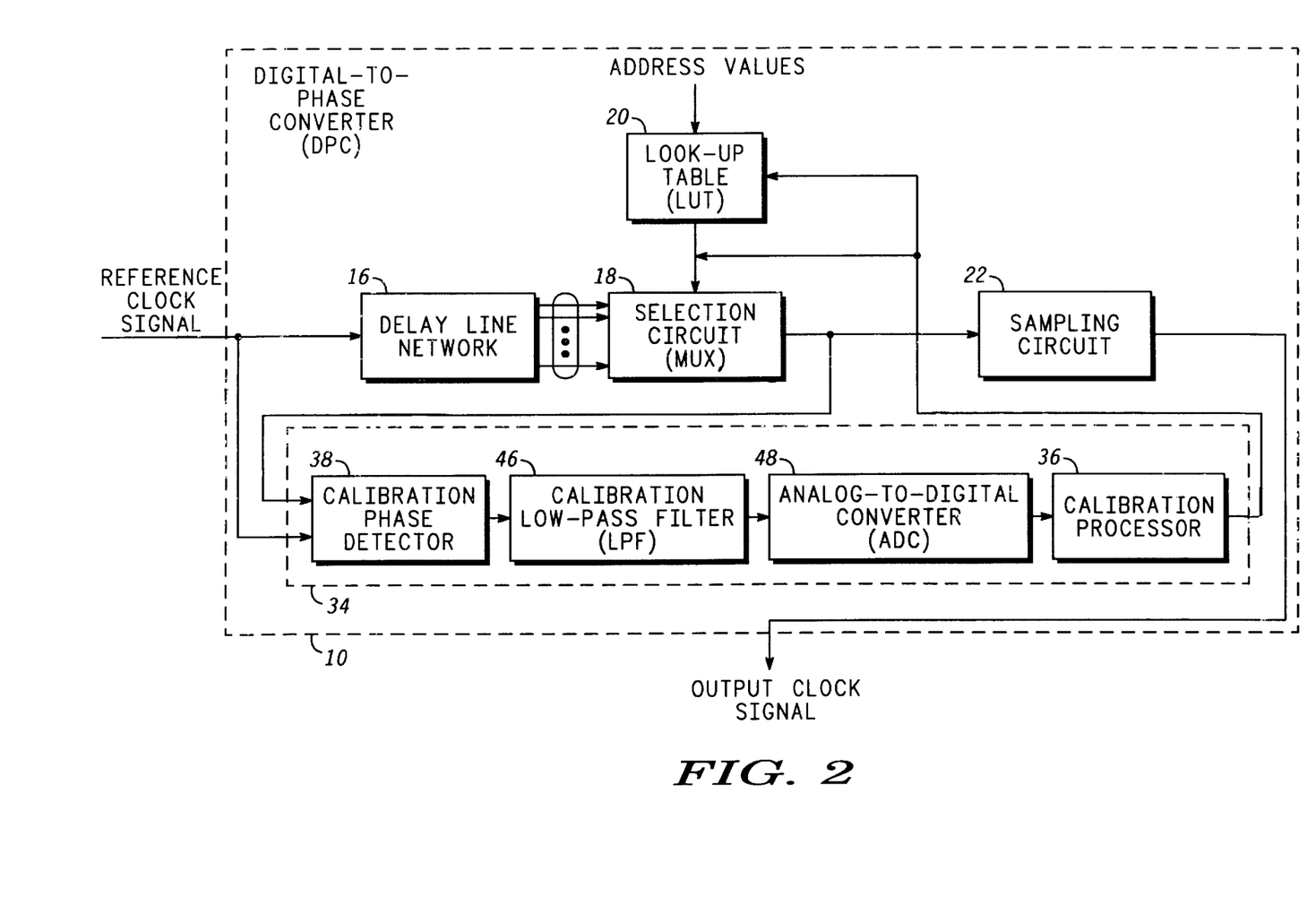
FIG. 2 is a block diagram showing the internal components of one embodiment of the digital-to-phase converter of FIG. 1.

With reference to FIG. 2, and with continuing reference to FIG. 1, DPC 10 includes a delay line network 16 connected to receive the reference clock signal and to output to a selection circuit or multiplexer (MUX) 18 a plurality of phase shifted clock signals. Each phase shifted clock signal is shifted in phase with respect to the reference clock signal and with respect to the other phase shifted clock signals. A look-up table (LUT) 20 is connected to receive the address values from numeric multiplier 8 and to provide to MUX 18 corresponding tap addresses. MUX 18 operates in a conventional way to connect one of the phase shifted clock signals to an output of MUX 18 as a function of the tap address received by MUX 18. More specifically, each tap address causes MUX 18 to connect a corresponding phase-shifted clock signal to its output.

A sampling circuit 22 is connected to receive each phase shifted clock signal output by MUX 18. Sampling circuit 22 also receives the latch signals from numeric multiplier 8. Each latch signal synchronizes the operation of sampling circuit 22 to sample at least a portion of each phase shifted clock signal output by MUX 18.

Preferably, DPC 10 also includes a calibration circuit 34 which will be described in greater detail hereafter.

Figure 3:
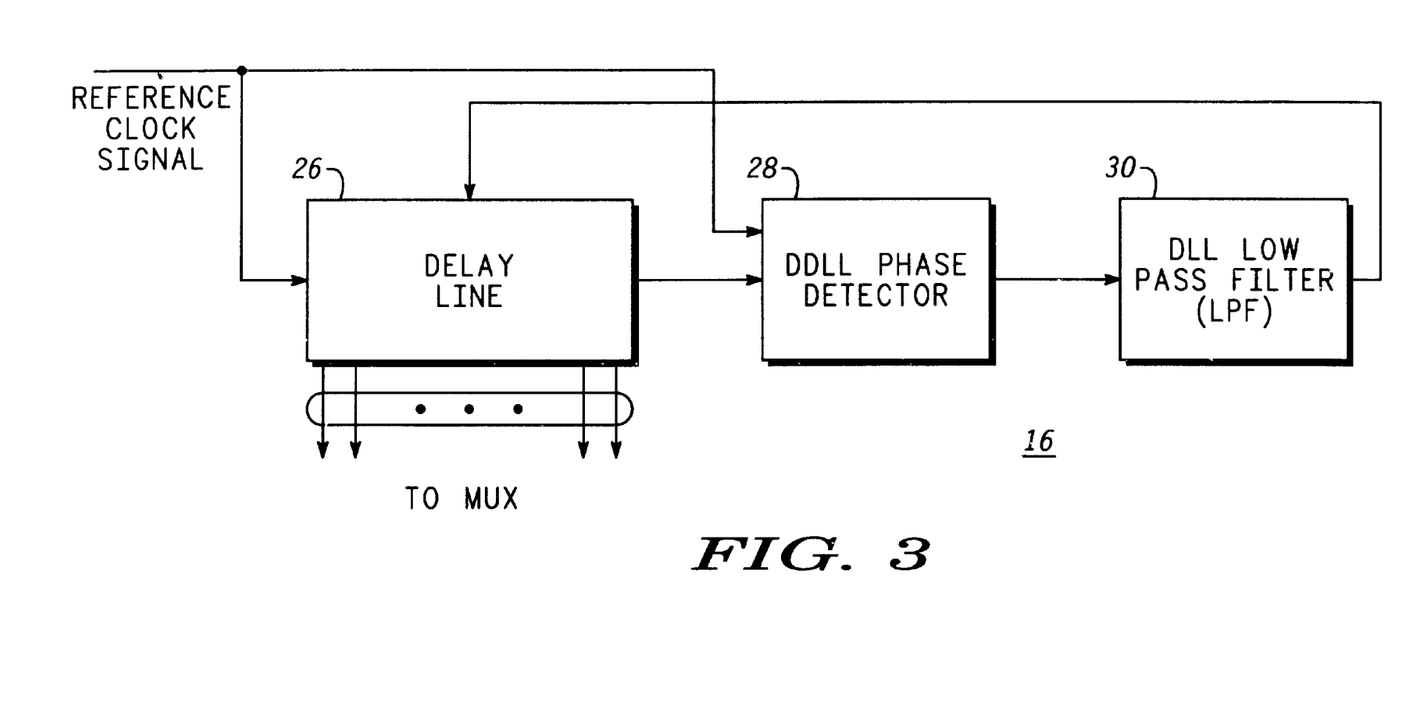
FIG. 3 is a block diagram showing the internal components of the delay line network of FIG. 2.

With reference to FIG. 3, and with continuing reference to all previous Figures, delay line network 16 includes a variable delay line 26 having an input connected to receive the reference clock signal from system clock 4 and the plurality of outputs which supply the plurality of phase shifted clock signals to MUX 18. To ensure stability during operation, delay line network 16 includes a delay lock loop (DLL) phase detector 28 connected to receive the reference clock signal from system clock 4 and a reference phase shifted clock signal from delay line 26. The reference phase shifted clock signal can be one of the phase shifted clock signals provided by delay line 26 to MUX 18 or can be a separate phase shifted clock signal supplied only to DLL phase detector 28. DLL phase detector 28 measures any phase difference between the reference clock signal and the reference phase shifted clock signal and outputs to a DLL low pass filter 30 an error signal related thereto. DLL low pass filter 30 converts the error signal into a DLL tuning signal which is supplied to delay line 26 to adjust the bias voltage thereof in a manner that maintains the phase relationship between the reference phase shifted clock signal and the reference clock signal during operation of delay line network 16. It will be recognized by those skilled in the art that the above illustration one implementation of this technology and tap sorting would be applicable to other delay topologies as well.

Figure 4:
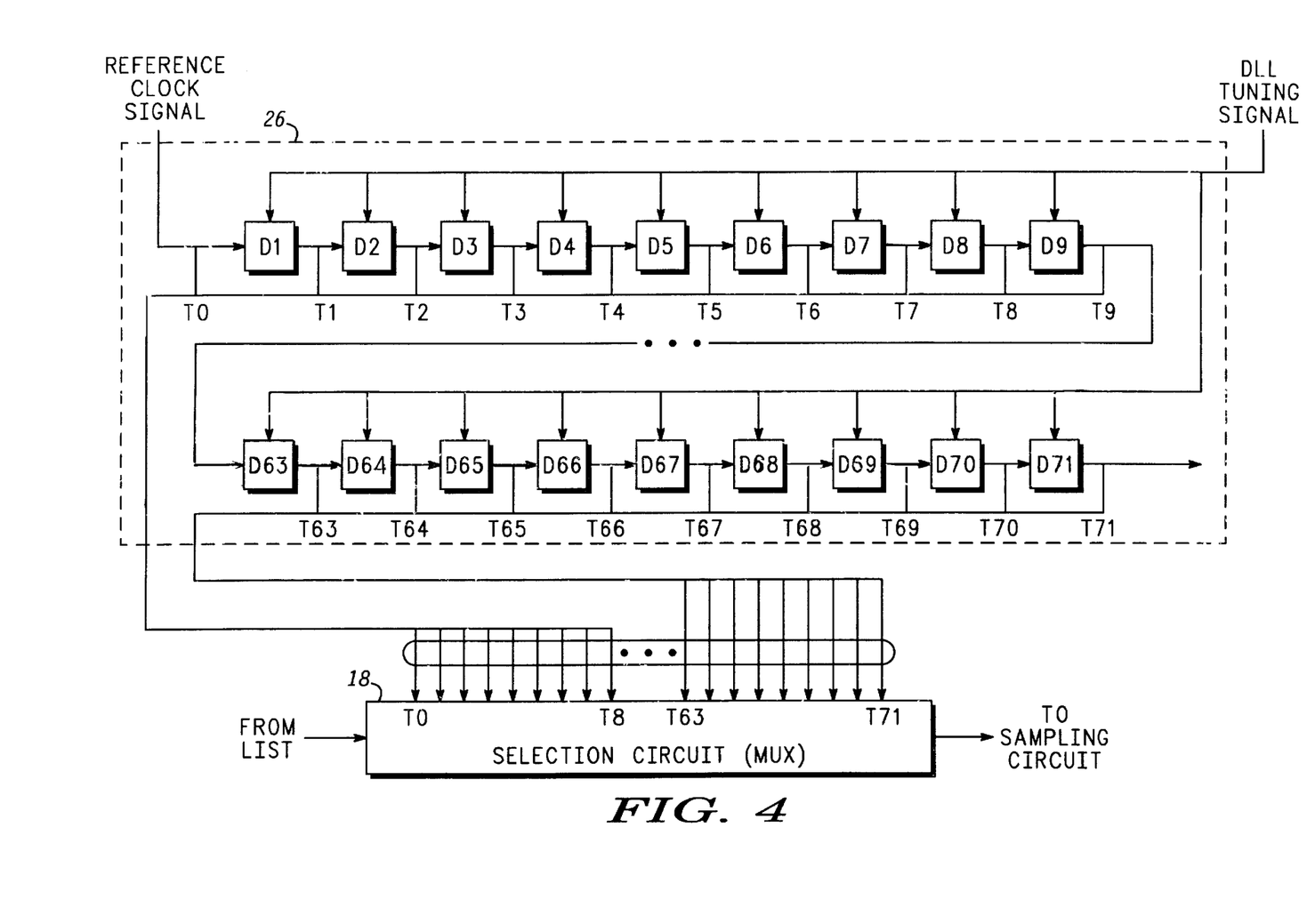
FIG. 4 is a block diagram of some of the internal components of the delay line of the delay line network of FIG. 3 connected to the selection circuit of FIG. 2.

With reference to FIG. 4, and with continuing reference to all previous Figures, delay line 26 includes a plurality of delay elements, e.g., D1–D71, connected in series. Each delay element D1–D71 has an output tap T1–T71 which is connected to an input of MUX 18. A tap T0 is connected between an input of delay element D1 and an input of MUX 18 in order to supply the reference clock signal thereto. Each delay element D1–D71 delays the propagation of the reference clock signal therethrough and outputs on its corresponding output tap T1–T71, respectively, a corresponding phase shifted clock signal. The seventy-one phase shifted clock signals output by delay elements D1–D71 are supplied via output taps T1–T71 to inputs of MUX 18 along with the reference clock signal output on tap T0.

Ideally, each delay element introduces a predetermined delay to the clock signal passing therethrough. In operation, however, one or more of the delay elements D1–D71 has lesser than or greater than the predetermined delay. This variation can arise from a number of factors, including random variations in the fabrication of the delay elements, called mismatch. To account for variances in the predetermined delay, a mapping is created between each address value supplied to LUT 20 and one of the tap addresses output by LUT 20 that results in the selection by MUX 18 of a desired phase shifted clock signal having a desired phase shift with respect to the reference clock signal to be output thereby.

Figure 5:
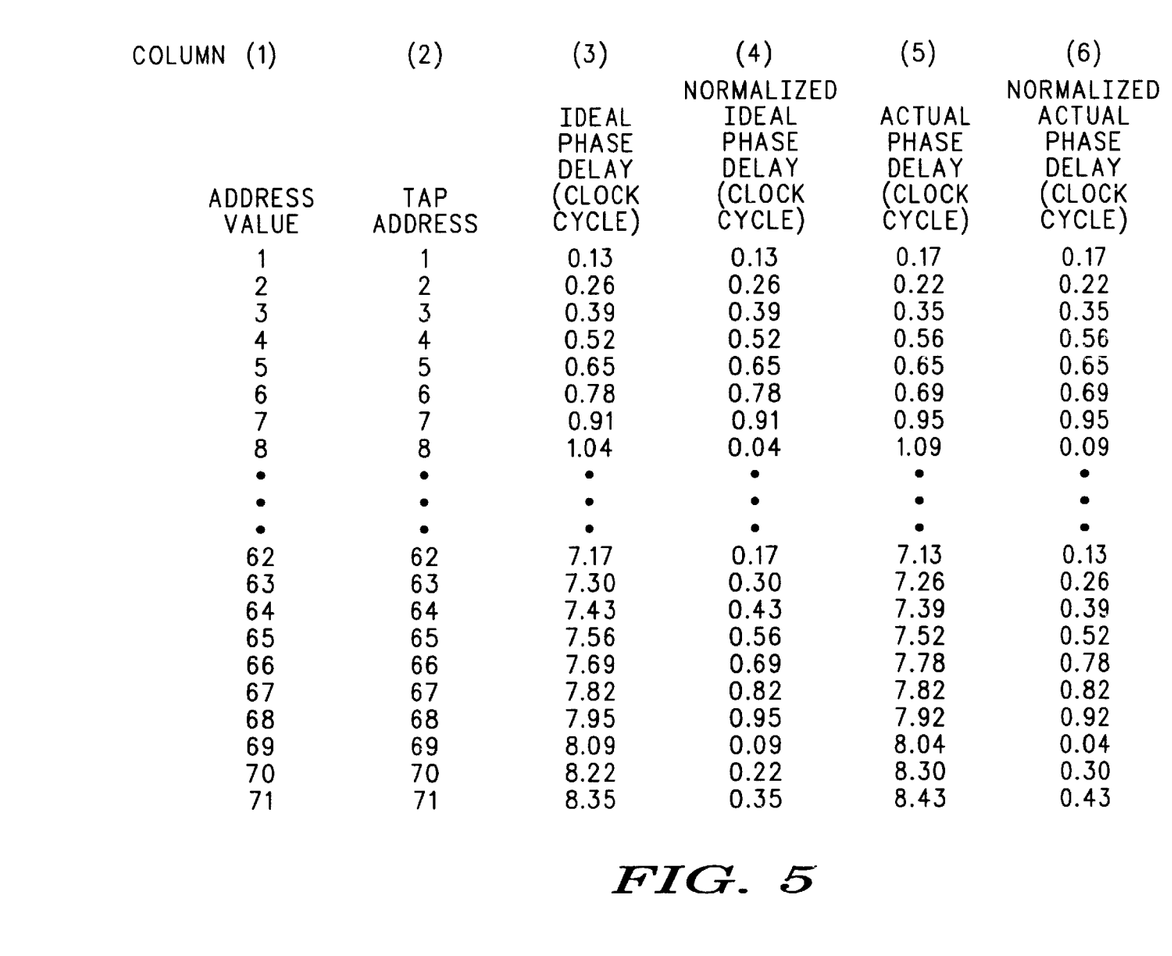
FIG. 5 is a spreadsheet showing the relationship between ideal phase delays and actual phase delays for the delay elements shown in FIG. 4 prior to generating a mapping between the address values input into the look-up table shown in FIG. 2 and the tap addresses output from the lookup table.

To better understand the need for this mapping, reference is now made to FIG. 5. In FIG. 5, the first three columns of each row show the relationship between an address value, a tap address which corresponds to an output tap T of delay line 26 and an ideal phase delay for the corresponding tap address with respect to the reference clock signal. Under ideal conditions, in response to receiving address value 1, LUT 20 outputs to MUX 18 tap address 1 which causes MUX 18 to connect to its output tap T1 of delay line 26 thereby supplying to sampling circuit 22 the phase shifted clock signal output by delay element D1, ideally having a phase delay of 0.13 clock cycles. However, as shown in column 5, the actual phase delay of the phase shifted clock signal output on tap T1 by delay element D1 is 0.17 clock cycles, due to errors in the delay of delay element.

In the examples shown in FIG. 5, many of the taps T1–T71 associated with the corresponding tap addresses have actual phase delays that are different than the ideal phase delays. However, some of the taps associated with the corresponding tap addresses, e.g., tap T5 and tap T67, have actual phase delays that match the ideal phase delays. In a real implementation, the actual delays may not precisely match the ideal phase delays. However, actual delays can be found that are very near in value to the ideal delays.

In order to reduce or eliminate unwanted spurious frequencies in the output clock signal, it is necessary to reduce or eliminate any difference between the ideal phase delay of the phase shifted clock signal output by each tap T1–T71 and the actual phase delay. In order to reduce or eliminate this difference, a mapping is stored in LUT 20 which maps each address value to one of the tap addresses supplied to MUX 18 as a function of a difference between the respective ideal phase delay and the actual phase delay of the phase shifted clock signal output by MUX 18.

In order to generate this mapping, any whole number of clock cycles of the ideal phase delay associated with each address value are ignored to obtain, as shown in column 4, a normalized ideal phase delay. For example, address value 1 has an ideal phase delay of 0.13 clock cycles. Since this ideal phase delay does not have an integer number of clock cycles associated therewith, its normalized ideal phase delay is the same value, i.e., 0.13 clock cycles. In contrast, address value 62 has an ideal phase delay of 7.17 clock cycles. To normalize this ideal phase delay, the integer value "7" is ignored to obtain the normalized ideal phase delay of 0.17 clock cycles for address value 62. This same procedure is applied to the actual phase delay for each address value in order to obtain the normalized actual phase delay value therefor.

Figure 6:
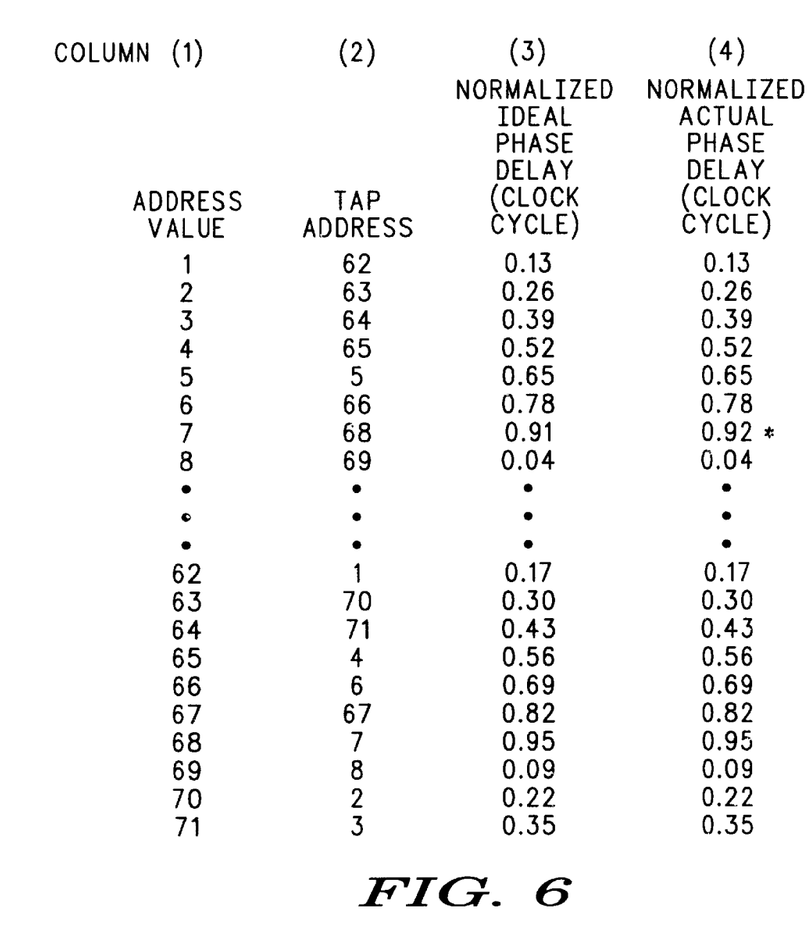
FIG. 6 is a spreadsheet showing the mapping between the address values and the tap addresses shown in FIG. 5 based upon a minimum difference between each normalized ideal phase delay for each address value and one of the normalized actual phase delays associated with one of the tap addresses.

With reference to FIG. 6, and with ongoing reference to FIG. 5, next, a search is initiated to determine which tap address has a normalized actual phase delay the same or closest to the normalized ideal phase delay associated with each address value. More particularly, the search finds the closest normalized actual phase delay for each normalized ideal phase delay. The address value associated with the normalized ideal phase delay is mapped to the tap address associated with the closest normalized actual phase delay. For example, as shown in FIG. 6, address value 1 has a normalized phase delay of 0.13 clock cycles and tap address 62 has a normalized actual phase delay of 0.13 clock cycles.

Since the normalized ideal phase delay of address value 1 and the normalized actual phase delay of tap address 62 have the same value, tap address 62 is mapped, or associated with, address value 1. As a further example, as shown in FIG. 6, address value 7 has a normalized ideal phase delay of 0.91 clock cycles. Assuming that a normalized actual phase delay of 0.91 clock cycles is not output on one of taps T1–T71 of delay line 26, the search routine searches for the normalized actual phase delay closest to the normalized ideal phase delay of the related address value. In the example shown for address value 7, tap address 68 has a normalized actual phase delay of 0.92 clock cycles, which is the closest available value to the normalized ideal phase delay of 0.91 clock cycles for address value 7. Accordingly, the search routine maps, or associates, tap address 68 with address value 7.

While not shown in FIG. 6, each tap address can be mapped to two or more address values. For example, if address value 1 and address value 20 (not shown) both have a normalized ideal phase delay of 0.13 clock cycles, tap address 62 having a normalized actual phase delay of 0.13 clock cycles can be mapped to address value 1 and address value 20. Moreover, it is not necessary that each tap address be mapped to an address value if another tap address is first mapped to the address value based on a correspondence between the normalized actual phase delay and the normalized ideal phase delay, respectively, or if the other tap address is mapped to the address value based upon the normalized actual phase delay representing the closest match with the normalized ideal phase delay, respectively.

The mapping shown in FIG. 6 is stored in LUT 20. Thereafter, in response to receiving an address value from numeric multiplier 8, LUT 20 outputs to MUX 18 the tap address that is mapped to the address value. For example, in response to receiving address value 1, LUT 20 outputs to MUX 18 tap address 62. In response to receiving tap address 62, MUX 18 connects its output to tap T62 of delay line 26. Similarly, in response to receiving address value 8, LUT 20 outputs tap address 69 to MUX 18. In response to receiving tap address 69, MUX 18 connects its output to tap T69 of delay line 26. Utilizing the address value to tap address mapping stored in LUT 20, a phase shifted clock signal having a normalized actual phase delay corresponding to a desired phase shifted clock signal having a normalized ideal phase delay can be supplied to sampling circuit 22.

Sampling circuit 22 is configured to receive the phase shifted clock signals from MUX 18 and the latch signals from numeric multiplier 8. The sampling of each phase shifted clock signal received by sampling circuit 22 is synchronized by a corresponding latch signal received from numeric multiplier 8. Each latch signal causes sampling circuit 22 to sample and output at least a portion of each phase shifted clock signal in the temporal order it is received by sampling circuit 22. The samples of the phase shifted clock signals output from sampling circuit 22 form the output clock signal having the same frequency as the average frequency of the accumulator overflow signal, but with the pulses of the output clock signal being more uniformly spaced than the pulses of the accumulator overflow signal. Because the output clock signal has more uniformly spaced pulses, the occurrence of spurious frequencies therein is substantially reduced when compared to the spurious frequencies produced by the accumulator overflow signal having less uniformly spaced pulses.

The numerical examples shown in FIGS. 5 and 6 and discussed herein are for illustration purposes only and are not to be construed as limiting the invention or exemplary of the actual delays through the delay elements D of delay line 26.

With reference back to FIG. 2, as discussed above, DPC 10 preferably includes calibration circuit 34 for generating the mapping between each address value and one of the tap addresses and for storing the mapping in LUT 20. Calibration circuit 34 includes a calibration processor 36.

Preferably, calibration processor 36 is a conventional programmable microprocessor operating under the control of a software program stored in a memory unit (not shown) thereof. The memory unit can include static memory, such as a PROM, for permanent storage of the software program as well as dynamic memory, such as RAM, for temporary storage of the software program and/or data during operation. Calibration processor 36 and the software program are configured to coact so that during generation of the mapping to be stored in LUT 20, calibration processor 36 causes LUT 20 to be isolated from MUX 18. To this end, the outputs of LUT 20 can be configured to include a tri-state buffer which can be set to a high impedance state by calibration processor 36 during generation and storage of the mapping in LUT 20.

When LUT 20 is isolated from MUX 18, calibration processor 36 supplies each tap address to MUX 18, one tap address at a time. In response to receiving each tap address, MUX 18 connects to its output the phase shifted clock signal of the corresponding tap T of delay line 26.

Calibration circuit 34 includes a calibration phase detector 38 which is connected to receive each phase shifted clock signal output by MUX 18. Calibration phase detector 38 is also connected to receive the reference clock signal from system clock 4.

Figure 7:
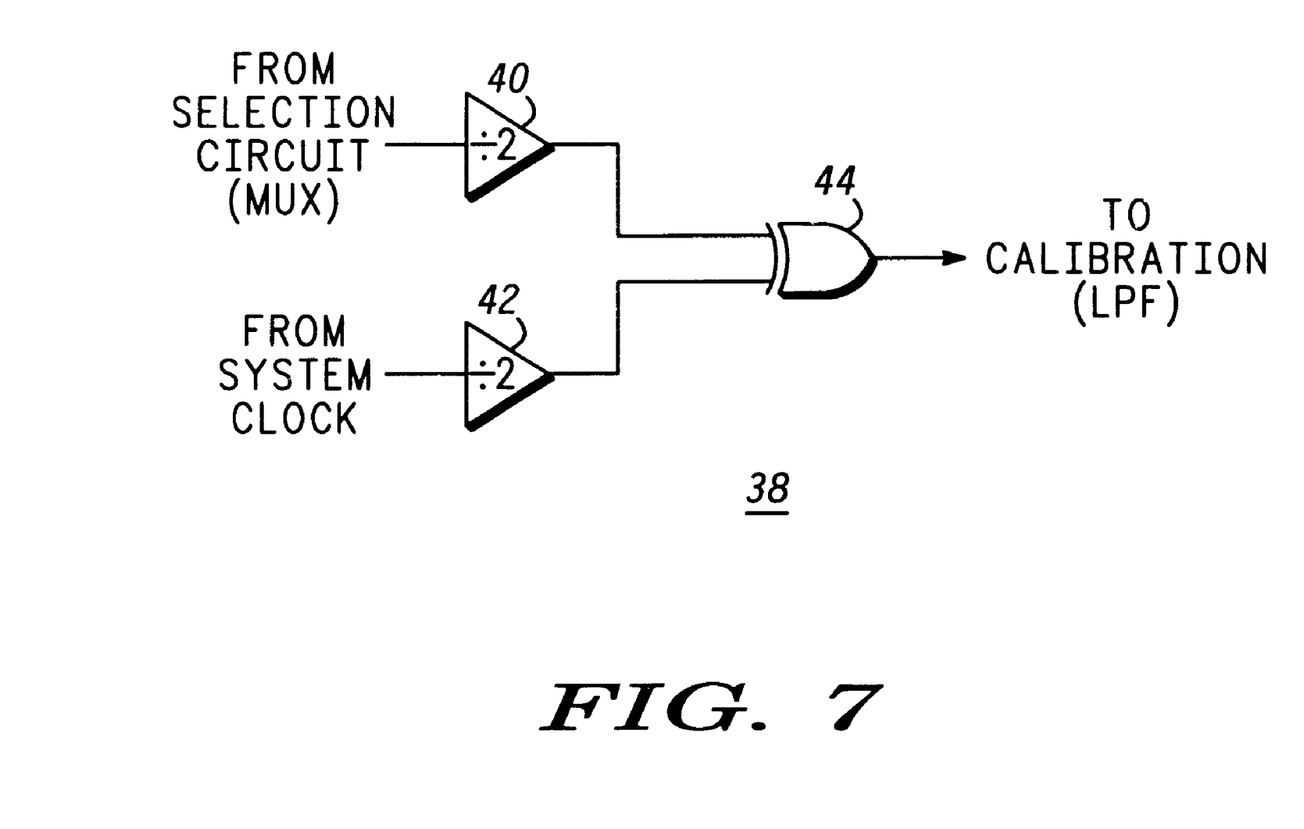
FIG. 7 is a block diagram showing the internal components of the calibration phase detector of FIG. 2.

With reference to FIG. 7, and with continuing reference to FIG. 2, preferably calibration phase detector 38 includes a divide-by-two frequency divider 40 connected to receive the phase shifted clock signal output by MUX 18 and a divide-by-two frequency divider 42 connected to receive the reference clock signal from system clock 4. In the embodiment of calibration phase detector 38 shown in FIG. 7, frequency dividers 40 and 42 are configured to reduce the frequency of the respective phase shifted clock signal and reference clock signal by one-half. The outputs of frequency-dividers 40 and 42 are supplied to inputs of an exclusive OR gate 44. In operation, exclusive OR gate 44 outputs a phase difference signal related to a phase difference between the reference clock signal and the phase shifted clock signal output by MUX 18. Preferably, the phase difference signal output by exclusive OR gate 44 is a train of pulses having an average voltage related to the phase difference between the reference clock signal and the phase shifted clock signal output by MUX 18. The phase difference signal output by exclusive OR gate 44 is supplied to a calibration low pass filter (LPF) 46 which is configured to filter AC components of the phase difference signal, leaving primarily only a DC component. Calibration LPF 46 outputs a low pass filtered phase difference signal to an analog-to-digital converter (ADC) 48 which converts the low pass filtered phase difference signal into a phase difference value for processing by calibration processor 36.

For each tap address supplied to MUX 18, calibration processor 36 stores the corresponding phase difference value output by ADC 48. The process of supplying each tap address to MUX 18 and storing the corresponding phase difference value continues until the phase difference value for each tap address has been stored. Next, calibration processor 36 maps each address value to one of the tap addresses in the manner described above in connection with FIGS. 5 and 6. To this end, calibration processor 36 maps each address value to one of the tap addresses as a function of a difference, i.e., the minimum difference, between the respective ideal phase difference value and phase difference value. Once the mapping is generated, calibration processor 36 stores the mapping in LUT 20. More specifically, calibration processor 36 stores each tap address in LUT 20 so that in response to receiving one of the address values, LUT 20 outputs the tap address which causes MUX 18 to connect to its output one of the phase shifted clock signals having the actual phase delay equal to or closest to the desired or ideal phase delay related to the one address value.

Figure 8:
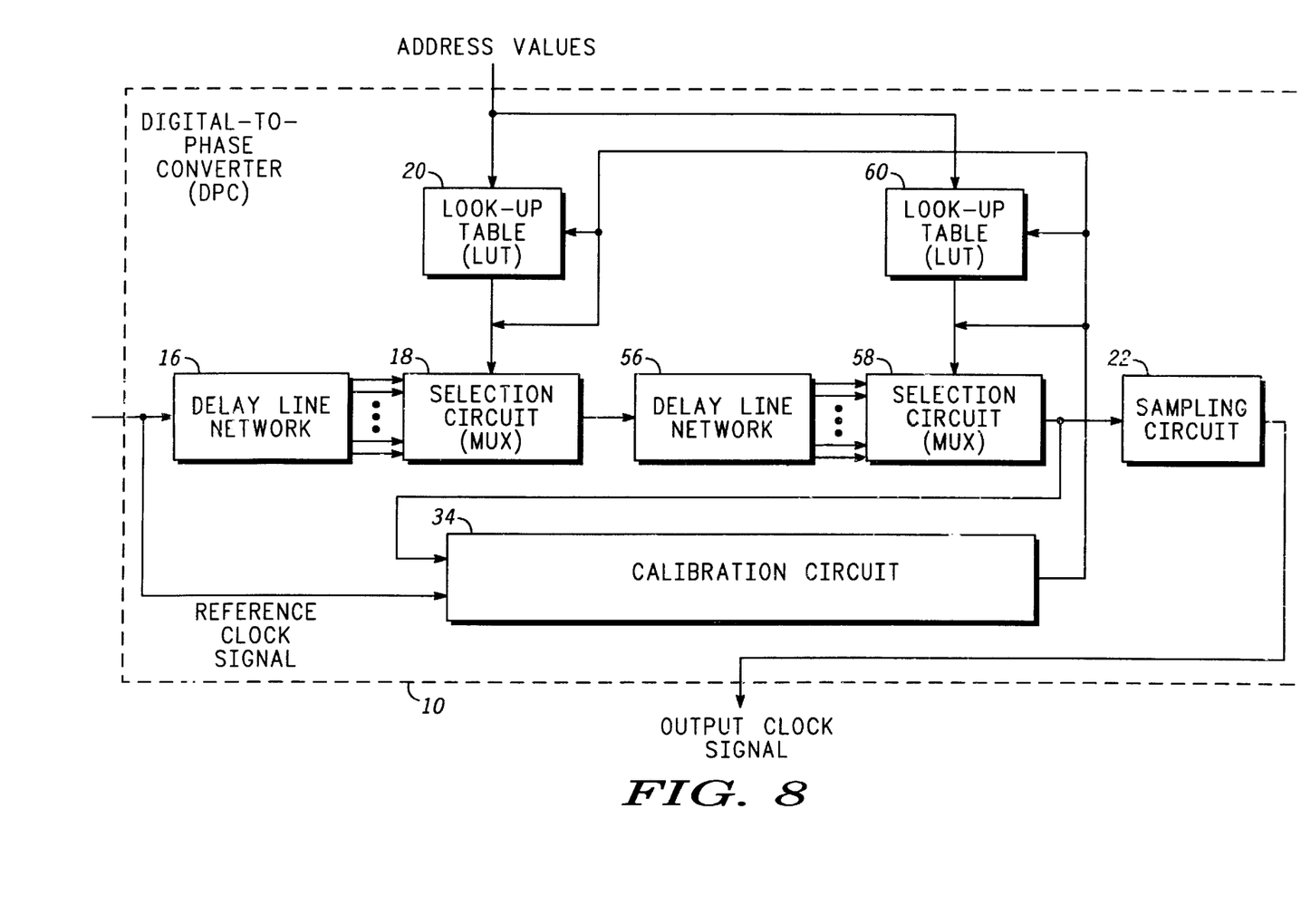
FIG. 8 is a block diagram showing the internal components of another embodiment of the digital-to-phase converter of FIG. 1.

With reference to FIG. 8, and with reference back to FIG. 1, another embodiment of DPC 10 includes the delay line network 16, MUX 18, LUT 20, sampling circuit 22 and calibration circuit 34 shown in FIG. 2. In addition, DPC 10 shown in FIG. 8 includes a delay line network 56, a selection circuit or multiplexer (MUX) 58 and a look-up table (LUT) 60. LUT 60 is connected to receive address values from numeric multiplier 8 and to supply tap addresses in the same manner as LUT 20. In addition, LUT 60 is connected to calibration circuit 34 in the same manner as LUT 20 to receive from calibration circuit 34 a mapping between address values and tap addresses in the same manner as LUT 20. Alternatively, LUT 20 AND LUT 60 can be combined into a single large LUT with some of the address bits connected to MUX 18 and the rest of the bits connected to MUX 58. Delay line network 56 is similar to delay line network 16 and is connected to receive each phase shifted clock signal output by MUX 18. In response to receiving each phase shifted clock signal output by MUX 18, delay line network 56 produces a plurality of secondary phase shifted clock signals which are supplied to MUX 58. In response to receiving an address value which is mapped to a tap address of MUX 58, MUX 58 outputs one of the secondary phase shifted clock signals to sampling circuit 22 which operates in the manner described above. An advantage of DPC 10 shown in FIG. 8 is that finer adjustments can be realized to the phase of the output pulses of the output clock signal. For example, if each delay element D of delay line networks 16 provided a delay of 1/32 of a clock cycle and each delay element D of delay line network 56 provided a delay of 1/31 of a clock cycle, the extent of adjustment available utilizing DPC 10 shown in FIG. 8 would be 1/992, i.e., the product of the delay of one delay element D in MUX 18 and the delay of one delay element D in MUX 58. It will father be evident to those skilled in the art that tap sorting as referred to herein applies to nay type of delay line such as passive, digital and/or analog as well as any type of DPC technology.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

What is claimed is:

1. A frequency synthesizer comprising:
   a system clock for producing a reference clock signal oscillating at a first frequency;
   a controller for generating a frequency control value corresponding to an output clock signal having a second frequency;
   circuitry for producing from the frequency control value and the reference clock signal a series of address values;
   a look-up table (LUT) for storing a plurality of tap addresses, the LUT configured to receive the series of address values and, in response to receiving the series of address values, to output a series of tap addresses, each address value having one tap address associated therewith;
   a delay line configured to receive the reference clock signal and to produce therefrom a plurality of phase shifted clock signals, each phase shifted clock signal oscillating at the first frequency and being shifted in phase with respect to the reference clock signal and with respect to the other phase shifted clock signals;
   a selection circuit configured to receive the series of tap addresses and the plurality of phase shifted clock signals and to output, in response to receiving the series of tap addresses, a series of phase shifted clock signals, each tap address having a phase shifted clock signal associated therewith; and
   a sampling circuit configured to receive the series of phase shifted clock signals and to output in response thereto samples of the series of phase shifted clock signals in the temporal order the phase shifted clock signals are received by the sampling circuit, each sample including at least a portion of one of the phase shifted clock signals and the samples of the series of phase shifted clock signals forming the output clock signal at the second frequency.

2. The frequency synthesizer as set forth in claim 1, wherein:
   each address value corresponds to an ideal phase shifted clock signal to be output by the selection circuit, each ideal phase shifted clock signal having an ideal phase shift with respect to the reference clock signal; and
   the LUT includes a mapping of each address value to a corresponding tap address which causes the selection circuit to output the phase shifted clock signal having a phase shift corresponding to the ideal phase shift of the desired phase shifted clock signal corresponding to the address value.

3. The frequency synthesizer as set forth in claim 2, wherein the selection circuit is a multiplexer.

4. The frequency synthesizer as set forth in claim 1, wherein:
   the delay line has a plurality of delay elements connected in series;
   each delay element has an output tap connected to an input of the selection circuit; and each delay element delays the propagation of the reference clock signal therethrough and outputs on its output tap a corresponding phase shifted clock signal.

5. The frequency synthesizer as set forth in claim 1, wherein two or more address values have the same tap address associated therewith.

6. The frequency synthesizer as set forth in claim 2, further including a calibration circuit for generating the mapping between each address value and one of the tap addresses, and for storing the mapping in the LUT.

7. The frequency synthesizer as set forth in claim 6, wherein the calibration circuit includes:
   a calibration processor for supplying each tap address to the selection circuit independent of the LUT;
   a calibration phase detector configured to receive each phase shifted clock signal output by the selection circuit and for generating for each phase shifted clock signal received thereby a phase difference signal related to a phase difference between the reference clock signal and the phase shifted clock signal;
   a low pass filter for low pass filtering the phase difference signal; and an analog-to-digital converter for converting the low pass filtered phase difference signal into a phase difference value for processing by the calibration processor.

8. The frequency synthesizer as set forth in claim 7, wherein the calibration processor:

stores for each address value an ideal phase difference value corresponding to a phase difference between the reference clock signal and the ideal phase shifted clock signal corresponding to the address value;

stores for each tap address the corresponding phase difference value;

maps each address value to one of the tap addresses as a function of a difference between the respective ideal phase difference value and phase difference value; and causes each tap address to be stored in the LUT so that in response to receiving one of the address values, the LUT outputs to the selection circuit the tap address which causes the selection circuit to output one of the phase shifted clock signals having the phase shift equal to or closest to the ideal phase shift of the one address value.

9. A method of synthesizing from an input clock signal oscillating at a first frequency an output clock signal oscillating at a second frequency, the method comprising the steps of:

(a) converting the input clock signal into a plurality of phase shifted clock signals, with each phase shifted clock signal oscillating at the first frequency and having a phase shift with respect to the input clock signal and with respect to the other phase shifted clock signals;

(b) mapping each phase shifted clock signal to a tap address;

(c) converting the input clock signal into a series of address values, with each address value related to an ideal phase shift of the input clock signal;

(d) mapping the series of address values to a series of the tap addresses, with each address value mapped to its corresponding tap address as a function of a difference between the respective ideal phase shift and phase shift with respect to the input clock signal;

(e) outputting a series of phase shifted clock signals corresponding to the series of tap addresses;

(f) sampling at least a portion of each phase shifted clock signal in the order it is output in step (e); and (g) outputting the sampled portions of the series of phase shifted clock signals to form the output clock signal oscillating at the second frequency.

10. The method as set forth in claim 9, wherein step (d) includes the steps of:

storing for each address value the ideal phase shift value related thereto;

determining for each tap address the phase shift related thereto; and mapping each address value to one of the tap addresses that minimizes the difference between the ideal phase shift and the phase shift, respectively.

11. An apparatus for synthesizing an oscillator signal having a desired frequency, the apparatus comprising:

a clock which produces a clock signal oscillating at a fixed frequency;

a delay line which receives the clock signal and which produces therefrom a plurality of phase shifted clock signals oscillating at the fixed frequency, with each phase shifted clock signal being shifted in phase with respect to the clock signal and with respect to the other phase shifted clock signals;

a look-up table (LUT) configured to receive an address value related to an ideal phase shifted clock signal oscillating at the fixed frequency and to output a tap address corresponding to the address value;

a selection circuit which receives the plurality of phase shifted clock signals and the tap address and which outputs, in response to receiving the tap address, one of the phase shifted clock signals; and a sampling circuit configured to sample at least a portion of the one phase shifted clock signal output by the selection circuit and to output the sampled portion of the one phase shifted clock signal to form at least part of the oscillator signal having the desired frequency.

12. The apparatus as set forth in claim 11, wherein:

in response to receiving a series of address values, the LUT outputs a corresponding series of tap addresses;

in response to receiving the series of tap addresses, the selection circuit outputs a corresponding series of phase shifted clock signals; and in response to receiving the series of phase shifted clock signals, the sampling circuit samples a portion of each of the phase shifted clock signals and outputs the sampled portions of the phase shifted clock signals to form the oscillator signal having the desired frequency.

13. The apparatus as set forth in claim 12, further including a calibration circuit for generating a mapping between each of a plurality of address values and one of a plurality of tap addresses, and for storing the mapping in the LUT.

14. The apparatus as set forth in claim 13, wherein the calibration circuit includes:

a calibration processor for supplying to the selection circuit the plurality of tap addresses;

a calibration phase detector configured to receive the clock signal and each phase shifted clock signal output by the selection circuit and to generate for each phase shifted clock signal received thereby a phase difference signal related to a phase difference between the clock signal and the phase shifted clock signal;

a low pass filter for low pass filtering the phase difference signal; and an analog-to-digital converter for converting the low pass filtered phase difference signal into a phase difference value for processing by the calibration processor.

15. The frequency synthesizer as set forth in claim 14, wherein the calibration processor:

stores for each address value an ideal phase difference value corresponding to a phase difference between the clock signal and the ideal phase shifted clock signal corresponding to the address value;

stores for each tap address the corresponding phase difference value;

maps each address value to one of the tap addresses as a function of a difference between the respective ideal phase difference value and phase difference value; and causes each tap address to be stored in the LUT so that in response to receiving one of the address values, the LUT outputs to the selection circuit the tap address which causes the selection circuit to output one of the phase shifted clock signals having a phase shift closest to an ideal phase shift of the ideal phase shifted clock signal corresponding to the one address value.

16. The frequency synthesizer as set forth in claim 15, wherein:

the calibration processor stores only the fractional part of each ideal phase difference value and the fractional part of each phase difference value; and the calibration processor maps each address value to one of the tap addresses as a function of a difference between the respective fractional part of the ideal phase difference value and fractional part of the phase difference value.

17. The frequency synthesizer as set forth in claim 16, wherein the phase shift between the ideal phase shifted clock signal and the phase shifted clock related together by the mapping of one of the address values to one of the tap addresses, respectively, is greater than one cycle of the clock signal.

18. The frequency synthesizer as set forth in claim 15, wherein:

the delay line includes a plurality of delay elements connected in series;

each delay element has an output tap connected to the selection circuit; and each delay element delays the propagation of the reference clock signal therethrough and outputs on its corresponding output tap a corresponding phase shifted clock signal.

19. The frequency synthesizer as set forth in claim 18, wherein:

each tap address corresponds to one of the output taps of the delay line; and in response to receiving each tap address, the selection circuit connects to an output thereof the output tap of the delay element corresponding to the tap address.

20. The frequency synthesizer as set forth in claim 12, further including:

another delay line which receives the series of phase shifted clock signals from the selection circuit and which produces from one of the phase shifted clock signals another plurality of phase shifted clock signals;

another LUT receives another address value related to another ideal phase shifted clock signal and to output another tap address related to the other address value; and another selection circuit which receives the other plurality of phase shifted clock signals and the other tap address and which outputs to the sampling circuit in response to receiving the other tap address one of the other plurality of phase shifted clock signals.

* * * * *